United States Patent
Kitagawa et al.

(10) Patent No.: US 6,563,359 B2
(45) Date of Patent: May 13, 2003

(54) SEMICONDUCTOR INTEGRATED CIRCUIT INCLUDING CLOCK MODULATION CIRCUIT

(75) Inventors: Yasuhiro Kitagawa, Kawasaki (JP); Sachie Takahashi, Aizuwakamatsu (JP); Yukihiro Yaguchi, Tokyo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/033,798

(22) Filed: Jan. 3, 2002

(65) Prior Publication Data

US 2002/0180496 A1 Dec. 5, 2002

(30) Foreign Application Priority Data

Jun. 5, 2001 (JP) .................................. 2001-169069

(51) Int. Cl.[7] .............................. G06F 1/04; H03K 3/00
(52) U.S. Cl. ...................................... 327/291; 327/113
(58) Field of Search ..................... 327/113–115, 117, 327/172, 176, 178, 291; 713/400, 500–503, 600, 601

(56) References Cited

U.S. PATENT DOCUMENTS

| | | | | |
|---|---|---|---|---|
| 5,052,389 A | * | 10/1991 | Henry | 607/32 |
| 5,070,473 A | * | 12/1991 | Takano et al. | 710/260 |
| 5,377,325 A | * | 12/1994 | Chan | 710/29 |
| 5,499,348 A | * | 3/1996 | Araki et al. | 711/100 |
| 5,581,745 A | * | 12/1996 | Muraoka et al. | 710/59 |
| 5,796,968 A | * | 8/1998 | Takamiya | 710/113 |

OTHER PUBLICATIONS

Patent Abstracts of Japan of JP 8–292216 dated Nov. 5, 1996.
Patent Abstracts of Japan of JP 2–153456 dated Jun. 13, 1990.
Patent Abstracts of Japan of JP 2–181252 dated Jul. 16, 1990.
Patent Abstracts of Japan of JP 9–319651 dated Dec. 12, 1997.

* cited by examiner

*Primary Examiner*—My-Trang Nu Ton
(74) *Attorney, Agent, or Firm*—Staas & Halsey, LLP (57) ABSTRACT

A clock modulation circuit modulates the frequency of a clock signal to generate a modulated clock signal. A wait requesting signal receives frequency information indicating the frequency of the modulated clock signal and, when the frequency information indicates a frequency higher than a reference frequency, generates a wait requesting signal to an external bus interface. Since an optimum wait cycle is inserted to the external bus interface according to a change of the frequency of the modulated clock signal, needless wait cycle can be prevented from being inserted to the external bus interface. As a result of this, it is possible to disperse the peak of radiated noise which is caused by the clock signal and to reduce electromagnetic interference, without decreasing performance of a system. Namely, it can serve both market needs for reducing noise and speeding up.

6 Claims, 8 Drawing Sheets

| frequency of SCLK[MHz] | frequency of OSC[MHz] | 1 wait insertion tAVDV | 1 wait insertion tAC | 2 waits insertion tAVDV | 2 waits insertion tAC |
|---|---|---|---|---|---|
| 16 | 32 | 131.3 | 187.5 | 193.8 | 250.0 |
| 17 | 34 | 122.1 | 176.5 | 180.9 | 235.3 |
| 18 | 36 | 113.9 | 166.7 | 169.4 | 222.2 |
| 19 | 38 | 106.6 | 157.9 | 159.2 | 210.5 |
| 20 | 40 | 100.0 | 150.0 | 150.0 | 200.0 |
| 21 | 42 | 94.0 | 142.9 | 141.7 | 190.5 |
| 22 | 44 | 88.6 | 136.4 | 134.2 | 181.8 |
| 23 | 46 | 83.7 | 130.4 | 127.2 | 173.9 |
| 24 | 48 | 79.2 | 125.0 | 120.8 | 166.7 |
| 25 | 50 | 75.0 | 120.0 | 115.0 | 160.0 |
| 26 | 52 | 71.2 | 115.4 | 109.6 | 153.8 |
| 27 | 54 | 67.6 | 111.1 | 104.6 | 148.1 |
| 28 | 56 | 64.3 | 107.1 | 100.0 | 142.9 |
| 29 | 58 | 61.2 | 103.4 | 95.7 | 137.9 |
| 30 | 60 | 58.3 | 100.0 | 91.7 | 133.3 |
| 31 | 62 | 55.6 | 96.8 | 87.9 | 129.0 |
| 32 | 64 | 53.1 | 93.8 | 84.4 | 125.0 | average access time(present invention) = 136.3ns
(average value within the bold-line frames)
average access time(conventional) = 174.2ns
(average value within the broken-line frame)

21.7% reduced

SEMICONDUCTOR INTEGRATED CIRCUIT INCLUDING CLOCK MODULATION CIRCUIT

BACKGROUND OF THE INVENTION

1. Field of the Invention

The present invention relates to a semiconductor integrated circuit including a clock modulation circuit for modulating the frequency of a clock signal.

2. Description of the Related Art

Operating frequencies of semiconductor integrated circuits such as a microcomputer are improving every year. Accordingly, electromagnetic interference with electric devices, which are close to the semiconductor integrated circuit, turns into a problem. In concrete, noise radiated from the microcomputer and the like causes the neighboring electric devices to malfunction. Especially, since a clock signal is oscillated with a predetermined frequency at all times, it is likely to generate radiated noise.

In order to reduce the electromagnetic interference due to the clock signal, a clock modulation circuit has been developed. The clock modulation circuit is implemented in the microcomputer to modulate the frequency of the clock signal at all times. The clock signal is modulated to disperse a peak of the radiated noise, thereby reducing the electromagnetic interference. The clock signal which is modulated by the clock modulation circuit (hereinafter referred to as a modulated clock signal) is supplied to an internal circuit of the microcomputer and external devices (electric devices) connected to the microcomputer. Note that, when the clock modulation circuit is embedded in the microcomputer, operation speeds of the internal circuit and the external devices change according to the frequency of the modulated clock signal, but the change of the operation speeds has little effect on a system.

When the clock modulation circuit is embedded in the microcomputer, the external devices connected to the microcomputer operate upon receiving the modulated clock signal which is generated in the clock modulation circuit. The frequency of the modulated clock signal cannot exceed maximum operating frequencies of the external devices, and therefore, it is necessary to set the maximum operating frequency of the modulated clock signal in accordance with the external device with the slowest operation speed. In other words, timing of the system should be designed by inserting a wait cycle, on the assumption that the modulated clock signal is supplied to the external device with the slowest operation speed. As this result, the number of the extra wait cycles to be inserted increases when the frequency of the modulated clock circuit is low, which causes a problem that the performance of the system decreases in general when the clock modulation circuit is embedded in the microcomputer.

The performance of the system can be improved by supplying a different clock signal not modulated, to the external device with the slow operation speed. In this case, however, the effect of reducing the radiated noise is not enough.

SUMMARY OF THE INVENTION

It is an object of the present invention to reduce electromagnetic interference in a semiconductor integrated circuit including a clock modulation circuit, without decreasing the performance of a system including the semiconductor integrated circuit.

According to one of the aspects of the present invention, the clock modulation circuit modulates the frequency of a clock signal to generate a modulated clock signal. A wait requesting circuit receives frequency information indicating the frequency of the modulated clock signal and, when the frequency information indicates a frequency higher than a reference frequency, generates a wait requesting signal to an external bus interface. Since an optimum wait cycle is inserted to the external bus interface according to the change of the frequency of the modulated clock signal, external devices connected to the external bus interface can be operated without fail. Needless wait cycle can be prevented from being inserted to the external bus interface, and hence the performance of the system can be improved even when the clock modulation circuit is embedded in the semiconductor integrated circuit. In concrete, operation cycles of the external devices connected to the external bus interface can be shortened. As a result of this, it is possible to disperse the peak of radiated noise which is caused by the clock signal and to reduce electromagnetic interference, without decreasing the performance of the system. Namely, it can serve both market needs for reducing noise and speeding up.

According to another aspect of the present invention, the wait requesting circuit includes a frequency detecting circuit. The frequency detecting circuit successively receives pieces of timing information as the frequency information, the timing information indicating timing of edges of the modulated clock signal, and detects the frequency of the modulated clock signal from a difference between two pieces of the timing information. Namely, the frequency of the modulated clock signal can be easily detected only by determining the difference between two pieces of the timing information. Especially, the circuit scale of the semiconductor integrated circuit can be reduced when the timing information, which is used in the clock modulation circuit for generating the modulated clock signal, can be used.

According to another aspect of the present invention, the wait requesting circuit includes a holding circuit which latches the timing information. Contents of the holding circuit are overwritten every time the timing information is newly supplied thereto. Further, the timing information of the immediately preceding clock is held in the holding circuit at all times. The frequency detecting circuit determines the frequency of the modulated clock signal from the difference between a piece of the most current timing information and a piece of the timing information of the immediately preceding clock which is already held in the holding circuit. One of these pieces of timing information can be latched in the holding circuit, and therefore, the frequency of the modulated clock signal can be easily detected.

According to another aspect of the present invention, the wait requesting circuit includes a register which can set the reference frequency from the exterior. For this reason, the reference frequency can be set according to the operating frequencies of the external devices which are connected to the external bus interface, and the optimum wait cycle can be inserted to the external bus interface. In other words, the optimum wait cycle can be inserted to the external bus interface in accordance with system specifications of users.

According to another aspect of the present invention, the wait requesting circuit includes a plurality of registers, respectively holding a plurality of the reference frequencies. Moreover, the wait requesting circuit generates a plurality of the wait requesting signals according to the reference frequencies, respectively, when the frequency information indicates a frequency higher than the reference frequencies.

For this reason, wait cycles of plural types can be inserted to the external bus interface, according to the frequency of the modulated clock signal. Since the number of the wait cycles to be inserted can be more strictly controlled, the performance of the system can be further improved.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, preferred embodiments of the present invention will be explained with reference to the drawings.

Figure 1:
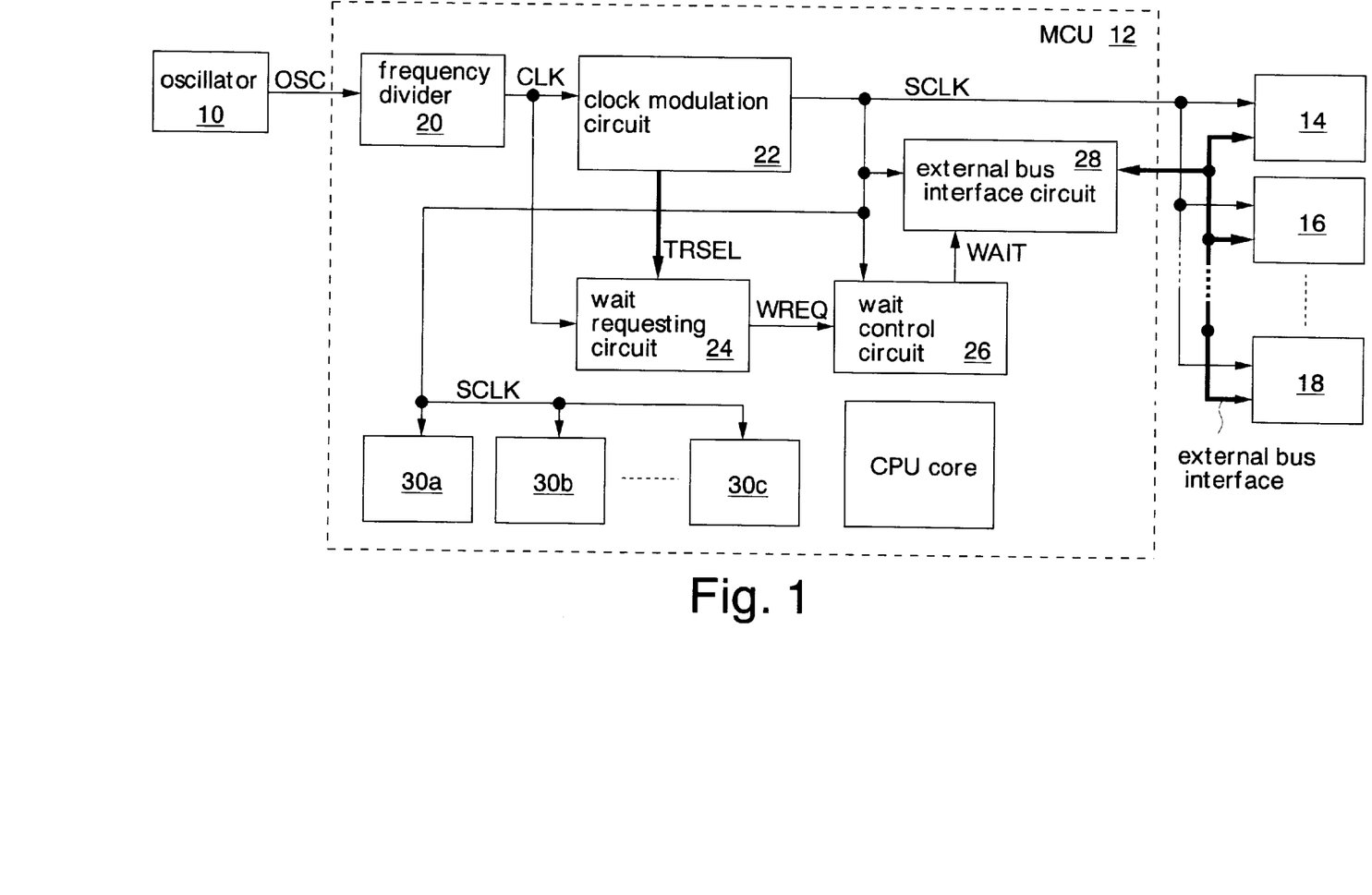
FIG. 1 is a block diagram showing a first embodiment of the present invention.

FIG. 1 shows a first embodiment of a semiconductor integrated circuit including a clock modulation circuit according to the present invention. Signal lines shown by bold lines in the drawing mean that each of these is structured by a plurality of the lines.

In this embodiment, a system is structured by an oscillator 10, a single chip microcomputer 12 (a semiconductor integrated circuit, hereinafter referred to as an MCU (Micro Controller Unit)), and a plurality of peripheral circuits 14, 16, and 18 (external devices) which are mounted on a printed-wiring board. The MCU 12 and the peripheral circuits 14, 16, and 18 are connected via an external bus interface. The oscillator 10 outputs an oscillating signal OSC whose frequency is, for example, 50 MHz.

The MCU 12 includes a frequency divider 20, a clock modulation circuit 22, a wait requesting circuit 24, a wait control circuit 26, an external bus interface circuit 28, a plurality of peripheral circuits 30a, 30b, and 30c, and a CPU core. The peripheral circuits 30a, 30b, and 30c include, for example, functions of a timer, an A/D converter, and a serial interface, respectively.

The frequency divider 20 divides the frequency of the oscillating signal OSC into two to generate a clock signal CLK. The clock modulation circuit 22 changes the timing of a rising edge and a falling edge of the clock signal CLK at all times to modulate the frequency of the clock signal CLK, and outputs the modulated signal as a system clock signal SCLK (modulated clock signal). The clock modulation circuit 22 outputs a rising edge selecting signal TRSEL consisting of four bits. The rising edge selecting signal TRSEL is the signal used inside the clock modulation circuit 22 in order to set the timing of the rising edge of the system clock signal SCLK. The system clock signal SCLK is supplied to the peripheral circuits 30a, 30b, 30c inside the MCU 12 and to the peripheral circuits 14, 16, and 18 through an external terminal.

The wait requesting circuit 24 receives the clock signal CLK and the edge selecting signal TRSEL and outputs a wait requesting signal WREQ. The wait control circuit 26 receives the wait requesting signal WREQ and the system clock signal SCLK and outputs a wait signal WAIT to the external bus interface circuit 28. In this embodiment, the wait control circuit 26 activates the wait signal WAIT for a period of one clock cycle, when the wait requesting signal WREQ is inactivated. When the wait requesting signal WREQ is activated, the wait control circuit 26 activates the wait signal WAIT for a period of two clock cycles. Corresponding to the wait signal WAIT, the external bus interface circuit 28 inserts a wait cycle to the external bus interface.

The peripheral circuits 14, 16, and 18 are, for example, a driver of a display apparatus, semiconductor memory and the like. Since the wait cycle is inserted to the external bus interface according to the frequency of the system clock signal SCLK by the wait requesting circuit 24, the wait control circuit 26 and the external bus interface circuit 28, the peripheral circuits 14, 16, and 18 operate without fail even when the frequency of the system clock signal SCLK changes.

Figure 2:
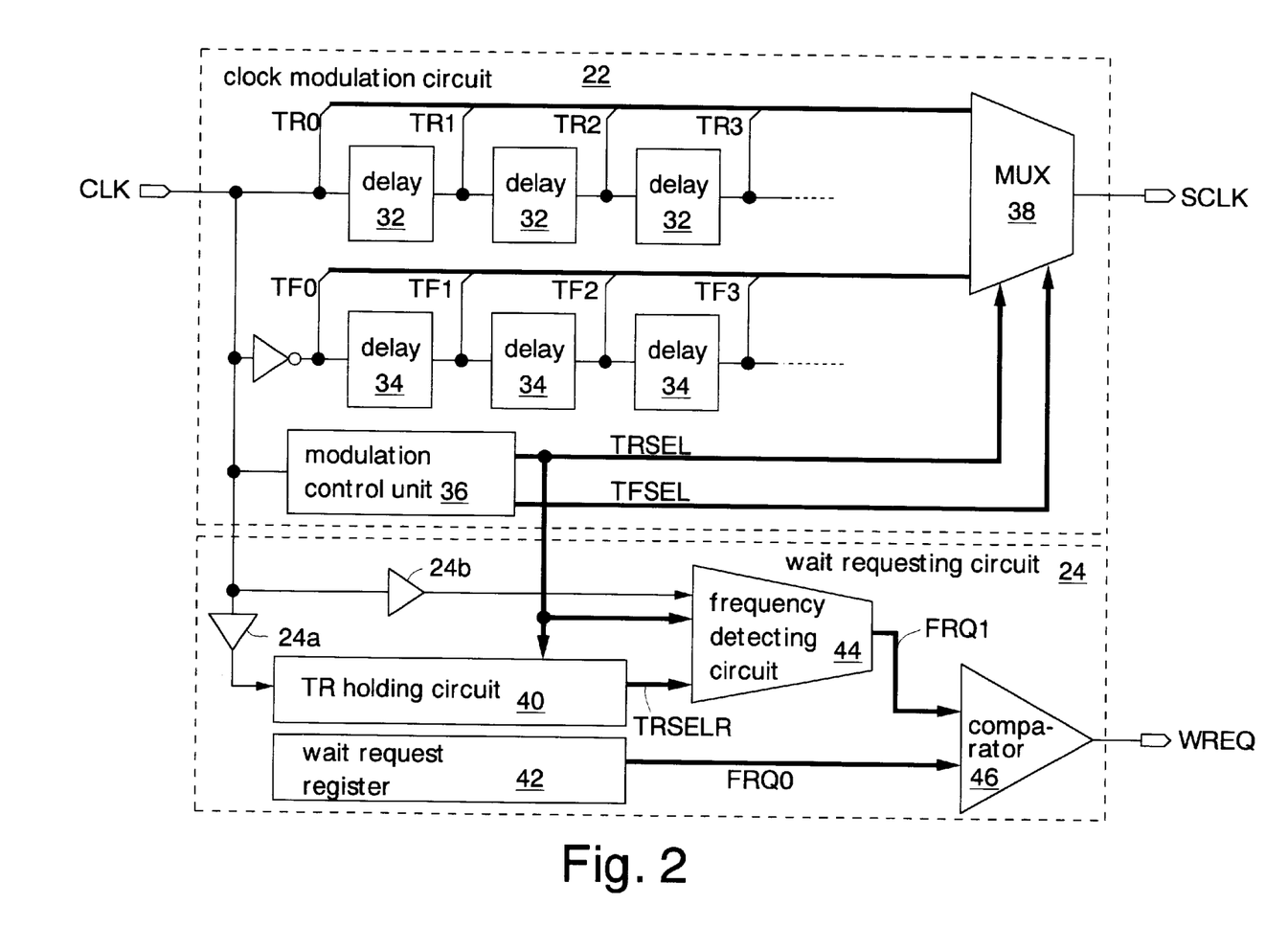
FIG. 2 is a block diagram showing in detail a clock modulation circuit and a wait requesting circuit of FIG. 1.

FIG. 2 shows the clock modulation circuit 22 and the wait requesting circuit 24 in detail.

The clock modulation circuit 22 includes a plurality of delay circuits 32 which are connected in cascade, a plurality of delay circuits 34 which are connected in cascade, a modulation control unit 36 and a multiplexer 38. The delay circuit 32 on an initial stage receives the clock signal CLK. The delay circuit 34 on an initial stage receives an inverting signal of the clock signal CLK.

The delay circuits 32 delay the clock signal CLK to output tap clock signals TR1, TR2, TR3 . . . . The delay circuits 34 delay the inverting signal of the clock signal CLK to output tap clock signals TF1, TF2, TF3 . . . .

The modulation control unit 36 outputs the rising edge selecting signal TRSEL (timing information) and a falling edge selecting signal TFSEL, in synchronization with the clock signal CLK. To be precise, the selecting signal TRSEL is outputted in synchronization with the rising edge of the clock signal CLK immediately preceding the clock signal CLK from which the system clock signal SCLK is generated. The selecting signal TFSEL is outputted in synchronization with the falling edge of the clock signal CLK immediately preceding the clock signal CLK from which the system clock signal SCLK is generated. In this embodiment, each of the selecting signals TRSEL and TFSEL consists of four bits, and there are the 16 possible selecting signals TRSEL and TFSEL to be outputted. The modulation control unit 36 has, for example, a random number generating circuit being embedded therein, and the selecting signals TRSEL and TFSEL are generated for each clock signal CLK according to the random number.

In accordance with the rising edge selecting signal TRSEL, the multiplexer 38 selects any of a tap clock signal TR0 whose timing is the same with that of the clock signal CLK and the tap clock signals TR1, TR2, TR3, . . . (hereinafter also referred to as TRn), each of which is the clock signal CLK with the delayed rising edge. In accordance with the falling edge selecting signal TFSEL, the multiplexer 38 selects any of a tap clock signal TF0 which is the inverted clock signal CLK and the tap clock signals TF1, TF2, TF3, . . . (hereinafter also referred to as TFn), each of which is the tap clock signal TF1 with the delayed falling edge. When, for example, the respective edge selecting signals TRSEL and TFSEL are "0010" and "0101" in binary notation, the multiplexer 38 selects the tap clock signals TR2 and TF5. Then, the multiplexer 38 generates the system clock signal SCLK which includes the rising edge of the clock signal TRn selected by the edge selecting signal TRSEL and the falling edge of the clock signal TFn selected by the edge selecting signal TFSEL.

The wait requesting circuit 24 includes buffers 24a and 24b, a TR holding circuit 40, a wait request register 42, a frequency detecting circuit 44 and a comparator 46.

The TR holding circuit 40 latches the edge selecting signal TRSEL at the rising edge of the clock signal CLK which is delayed by the buffer 24a, and outputs the latched signal as a held select signal TRSELR. In this embodiment, the edge selecting signal TRSEL, which is used in the clock modulation circuit 22 for changing the frequency of the system clock signal SCLK, is used, and hence it is possible to reduce the circuit scale of the MCU 12.

The wait request register 42 holds frequency information (reference frequency) indicating the frequency of the system clock signal SCLK which needs the wait request, and outputs the held frequency information as a frequency signal FRQ0. The wait request register 42 is the register which can be set from the exterior of the MCU 12. In concrete, values which are stored in the wait request register 42 are set in advance by a user (system program), according to operating frequencies of the peripheral circuits 14, 16, 18 which are mounted on the system.

The frequency detecting circuit 44 determines the frequency of the system clock signal SCLK by using the current edge selecting signal TRSEL (timing information) output from the clock modulation circuit 22 and the preceding edge selecting signal TRSEL (timing information) already held in the TR holding circuit 40, in synchronization with the rising edge of the clock signal CLK which is delayed by the buffer 24b, and outputs the determined frequency as a frequency signal FRQ1. In other words, the frequency detecting circuit 44 is the circuit for detecting the frequency by determining the difference between the timing of the neighboring rising edges of the system clock signal SCLK.

The comparator 46 outputs the wait requesting signal WREQ when the frequency (frequency signal FRQ1) which is determined by the frequency detecting circuit 44 is higher than the frequency (frequency signal FRQ2) which is held in the wait request register 42.

Figure 3:
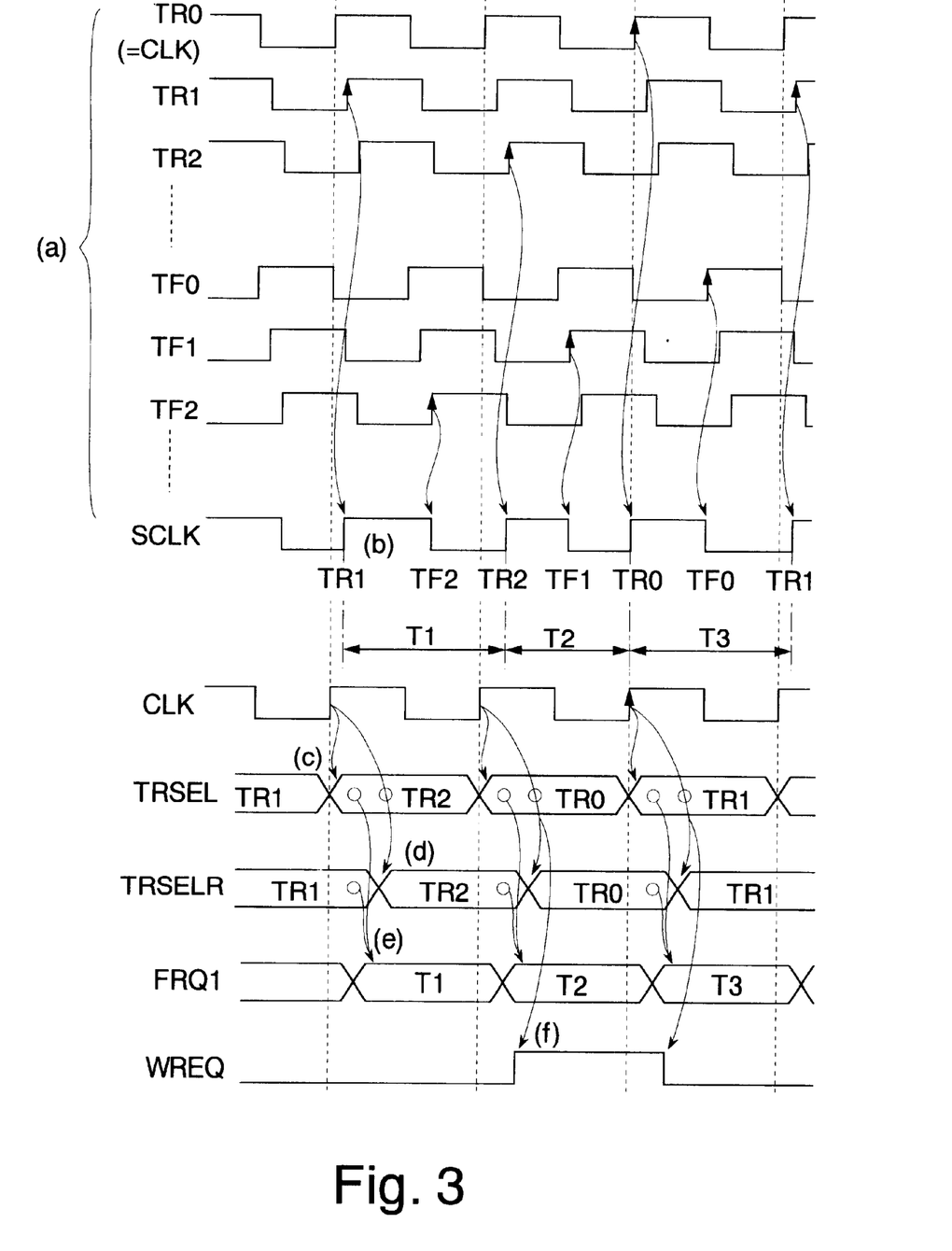
FIG. 3 is a timing chart showing the operations of the clock modulation circuit and the wait requesting circuit of FIG. 1.

FIG. 3 shows the operations of the clock modulation circuit 22 and the wait requesting circuit 24.

The clock modulation circuit 22 outputs the tap clock signals TR0, TR1, TR2, . . . , each of which is the delayed clock signal CLK, and the tap clock signals TF0, TF1, TF2, . . . , each of which is the delayed inverting signal of the clock signal CLK (FIG. 3(a)). The multiplexer 38 generates the system clock signal SCLK according to the edge selecting signals TRSEL and TFSEL from the modulation control unit 36 (FIG. 3(b)).

The modulation control unit 36 in the clock modulation circuit 22 outputs the edge selecting signal TRSEL (and TFSEL) in synchronization with the rising edge of the clock signal CLK immediately preceding the clock signal CLK from which the system clock signal SCLK is generated (FIG. 3(c)). The TR holding circuit 40 latches the edge selecting signal TRSEL in synchronization with the rising edge of the clock signal CLK which is delayed by the buffer 24a, and outputs it as the held select signal TRSELR (FIG. 3(d)).

The frequency detecting circuit 44 generates the frequency signal FRQ1 indicating the frequency of the present system clock signal SCLK, from the edge selecting signal TRSEL and the held select signal TRSELR (FIG. 3(e)). The comparator 46 compares the frequency signals FRQ1 and FRQ0, in synchronization with the rising edge of the clock signal CLK which is delayed by the buffer 24a. The comparator 46 activates the wait requesting signal WREQ when the frequency indicated by the frequency signal FRQ1 is higher than the frequency indicated by the frequency signal FRQ0 (FIG. 3(f)). Namely, the wait requesting signal WREQ is generated when the frequency of the system clock signal SCLK is higher than the reference frequency which is set in the wait request register 42. The wait control circuit 26 shown in FIG. 1 generates the wait signal WAIT in accordance with the wait requesting signal WREQ. Then, the external bus interface circuit 28 inserts the wait cycle to the external bus interface according to the wait signal WAIT.

Figure 4:
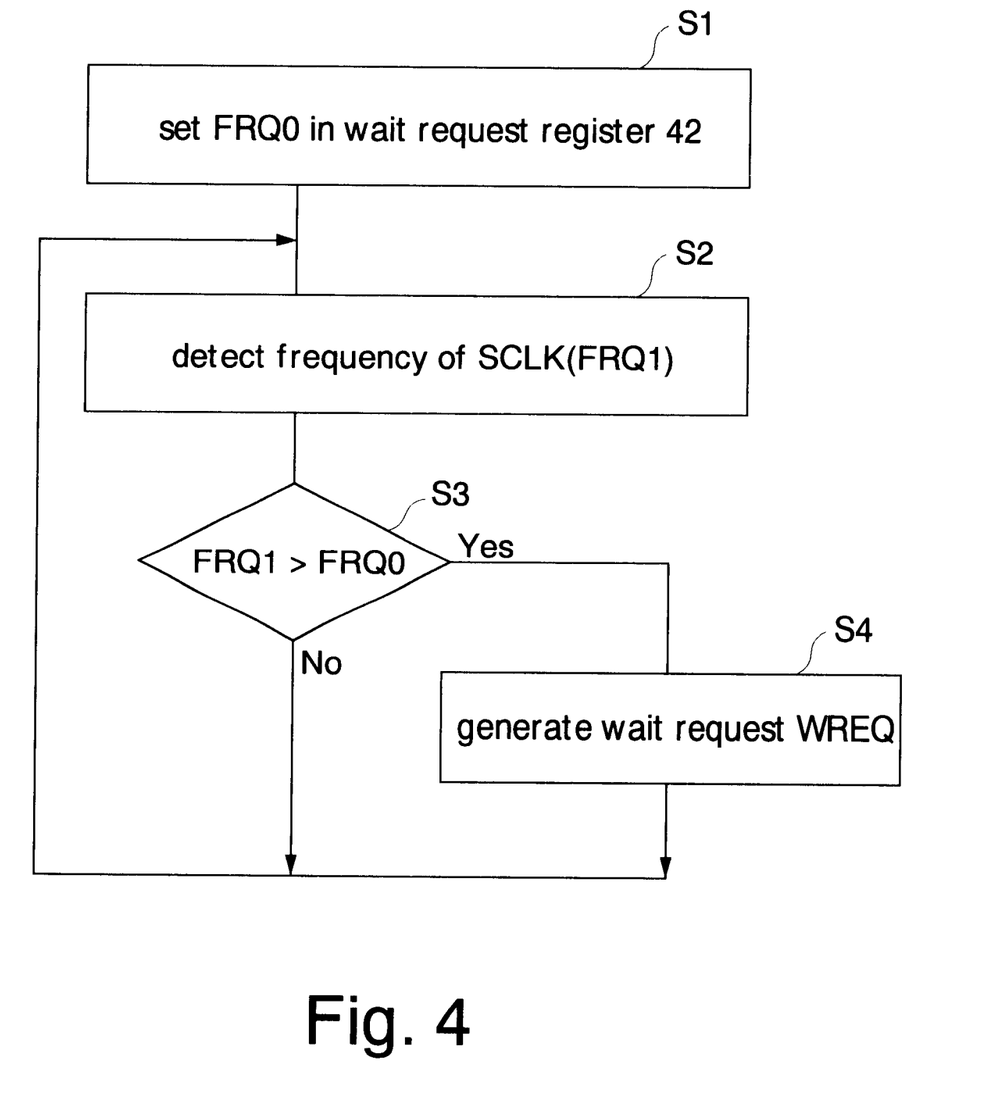
FIG. 4 is a flowchart showing the operation of the wait requesting circuit.

FIG. 4 shows the operation of the wait requesting circuit 24 shown in FIG. 2.

First, in the step S1, the frequency signal FRQ0 indicating the reference frequency which needs the request of two waits is set in the wait request register 42. The frequency signal FRQ0 is set, for example, by the system program when the power of the system is turned on.

In the step S2, the frequency detecting circuit 44 detects the frequency of the system clock signal SCLK. The detected frequency is outputted as the frequency signal FRQ1. In the step S3, the comparator 46 compares the frequency signals FRQ1 and FRQ0. When the frequency signal FRQ1 is higher than the frequency signal FRQ0, the comparator 46 generates the wait requesting signal WREQ in the step S4. When the frequency signal FRQ1 is equal to or lower than the frequency signal FRQ0, the processing goes back to the step S2.

Figure 5:
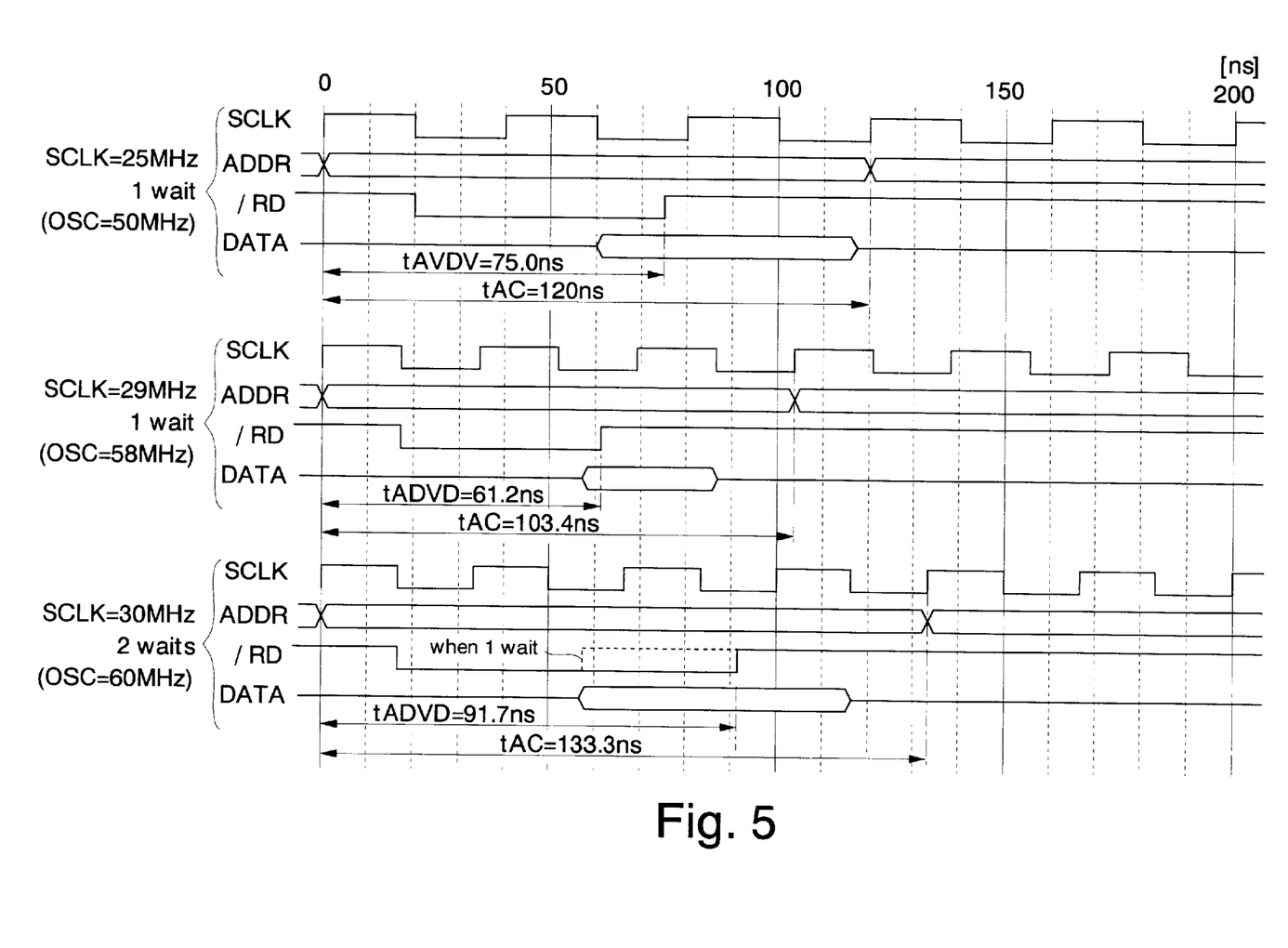
FIG. 5 is a timing chart showing reading operation of an MCU 12 of the first embodiment.

FIG. 5 shows an example in which the MCU 12 shown in FIG. 1 carries out reading operation of the peripheral circuit 14 (or 16 or 18). In this example, the frequency signal FRQ0 indicating the frequency of 29 MHz is stored in the wait request register 42. For this reason, two waits are inserted when the frequency of the system clock signal SCLK is higher than 29 MHz, and one wait (standard cycle) is inserted when it is equal to or lower than 30 MHz.

When the frequency of the system clock signal SCLK is 25 MHz, the external bus interface circuit 28 inserts one wait to the external bus interface. In this case, a data validation time tAVDV, which is from when an address signal ADDR to the peripheral circuit 14 is validated to when a data signal DATA outputted from the peripheral circuit 14 is validated, is 75.0 ns, and an access time tAC (reading cycle time) which is necessary for the reading operation is 120 ns (three clock cycles).

When the frequency of the system clock signal SCLK is 29 MHz, the external bus interface circuit 28 inserts one wait to the external bus interface. The data validation time tAVDV is 61.2 ns, and the access time tAC (reading cycle time) which is necessary for the reading operation is 103.4 ns (three clock cycles).

When the frequency of the system clock signal SCLK is 30 MHz, the external bus interface circuit 28 inserts two waits to the external bus interface. The data validation time tAVDV is 91.7 ns, and the access time tAC (reading cycle time) which is necessary for the reading operation is 133.3 ns (four clock cycles). Incidentally, inactivation timing of a read control signal/RD which is outputted from the MCU 12 in the case of one wait is shown by the broken line for the reference purpose.

Figure 6:
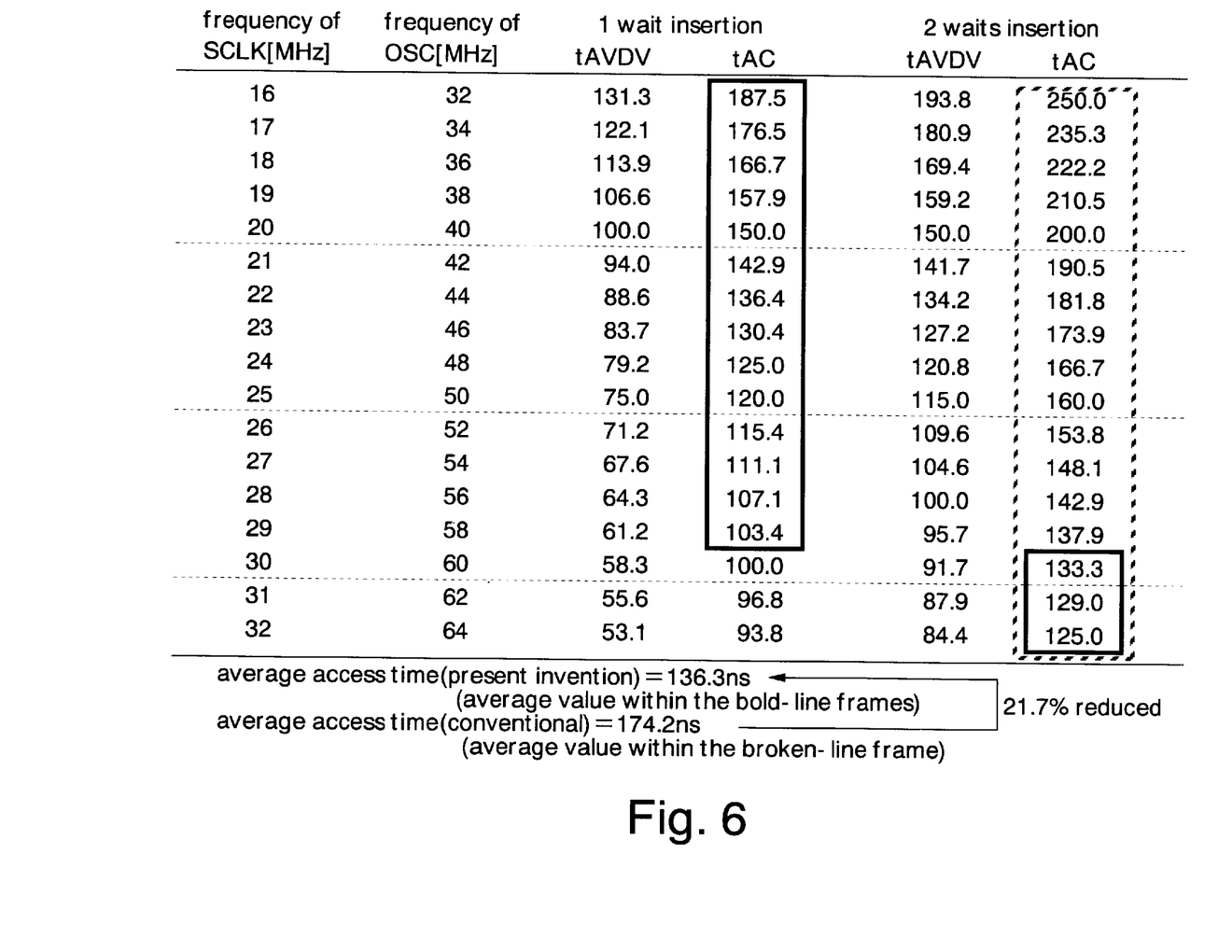
FIG. 6 is an explanatory view showing data validation time tAVDV and access time tAC with various clock frequencies according to the first embodiment.

FIG. 6 shows the data validation time tAVDV and the access time tAC with various clock frequencies when one wait is inserted and two waits are inserted, supposing that a device whose access time tAC is 100 ns is connected to the external bus interface. The MCU 12 of this embodiment inserts one wait when the frequency of the system clock signal SCLK is equal to or lower than 29 MHz, and inserts two waits when it is higher than 29 MHz, as shown in thick frames in the drawing.

A mean value of the access time tAC in the thick frames is 136.3 ns. Meanwhile, when the present invention is not applied thereto, it is necessary that the MCU 12 inserts two waits to the peripheral circuits at all times (in a frame by the broken line in the drawing). In this case, a mean value of the access time tAC becomes 174.2 ns. Therefore, by applying the present invention, it is possible to shorten operation cycles of the peripheral circuits 14, 16, 18. In the above example, the access time tAC can be shortened by 21.7%.

In this embodiment as described above, one wait cycle or two wait cycles is/are inserted to the external bus interface according to the frequency of the system clock signal SCLK. Since needless wait cycle can be prevented from being inserted to the external bus interface, it is possible to improve the performance of the system in the semiconductor integrated circuit including the clock modulation circuit 22. In other words, it is possible to disperse a peak of radiated noise which is caused by the system clock signal SCLK and to reduce electromagnetic interference, without decreasing the performance of the system. Namely, it can serve both market needs for reducing noise and speeding up.

The TR holding circuit 40 and the frequency detecting circuit 44 are formed in the wait requesting circuit 24. Therefore, the frequency of the modulated clock signal can be easily detected only by determining the difference between the timing of the neighboring rising edges of the system clock signal SCLK, by using the edge selecting signal TRSEL as the timing information and the held select signal TRSELR as the timing information of the immediately preceding clock. Particularly, since the edge selecting signal TRSEL which is used in the clock modulation circuit 22 is used, the circuit scale of the MCU 12 can be reduced.

The wait request register 42 whose reference frequency can be set from the exterior is formed in the wait requesting circuit 24. For this reason, the reference frequency can be set according to the operating frequencies of the peripheral circuits 14, 16, and 18 which are connected to the MCU 12, and the optimum wait cycle can be inserted to the peripheral circuits 14, 16, and 18. In other words, the optimum wait cycle can be inserted in accordance with system specifications of the users.

Figure 7:
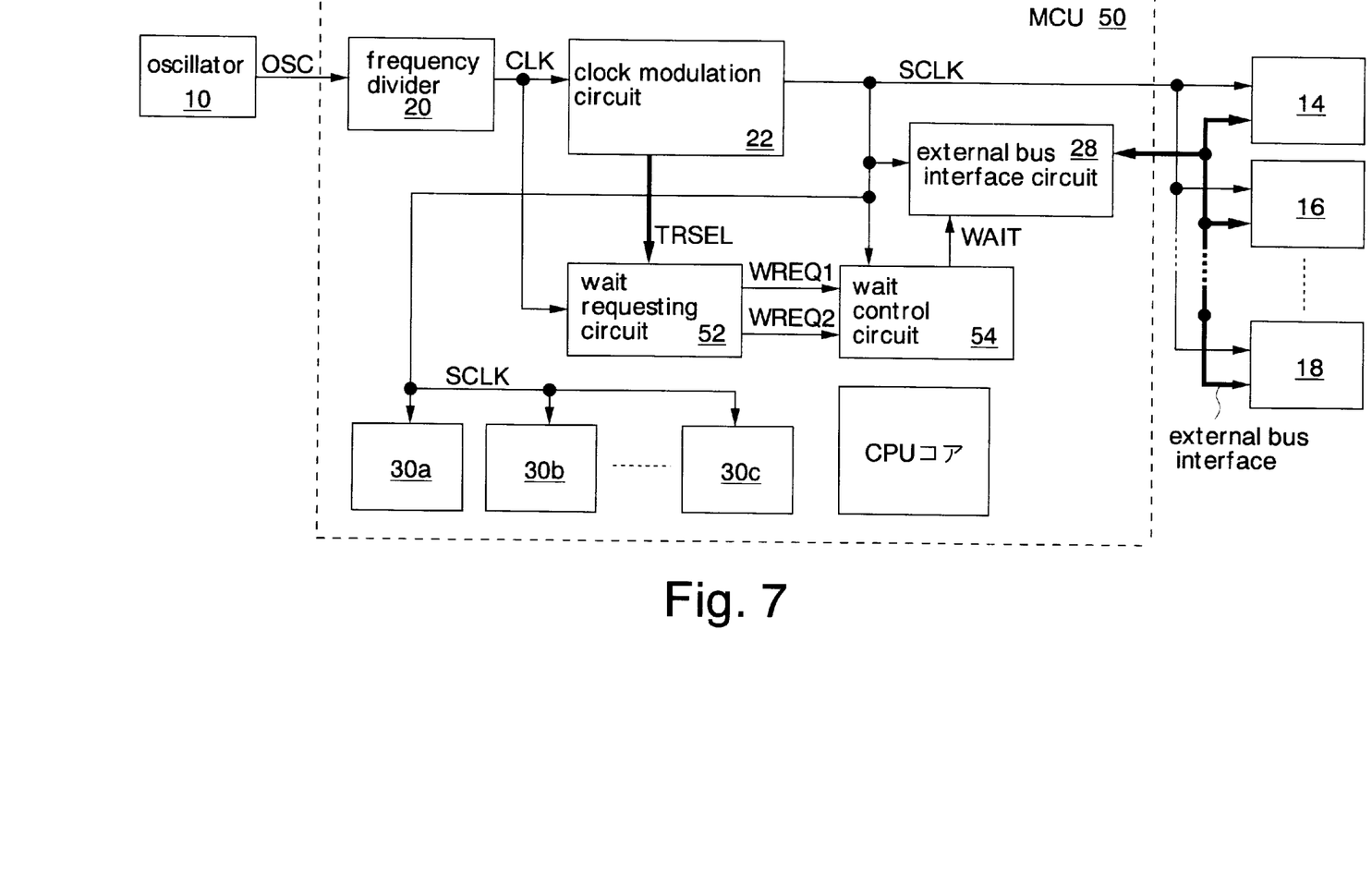
FIG. 7 is a block diagram showing a second embodiment of the present invention.

FIG. 7 shows a second embodiment of the semiconductor integrated circuit including the clock modulation circuit according to the present invention. The same numerals and symbols are given to the same circuits/signals as those explained in the first embodiment, and detailed explanations thereof are omitted.

In this embodiment, a system is structured by an oscillator 10, an MCU 50, and a plurality of peripheral circuits 14, 16, and 18 (external devices) which are mounted on a printed-wiring board. The MCU 50 includes a wait requesting circuit 52 and a wait control circuit 54, instead of the wait requesting circuit 24 and the wait control circuit 26 in the first embodiment. The rest of the structure of the MCU 50 is almost identical to the MCU 12 in the first embodiment.

The wait requesting circuit 52 outputs wait requesting signals WREQ1 and WREQ2, according to the frequency of a system clock signal SCLK (modulated clock signal). The wait control circuit 54 activates a wait signal WAIT for a period of two clock cycles when the wait requesting signal WREQ1 is activated. The wait control circuit 54 activates the wait signal WAIT for a period of three clock cycles when the wait requesting signals WREQ1 and WREQ2 are activated. The wait control circuit 54 activates the wait signal WAIT for a period of one clock cycle when the wait requesting signals WREQ1 and WREQ2 are inactivated. Corresponding to the wait signal WAIT, an external bus interface circuit 28 inserts a wait cycle to an external bus interface.

Figure 8:
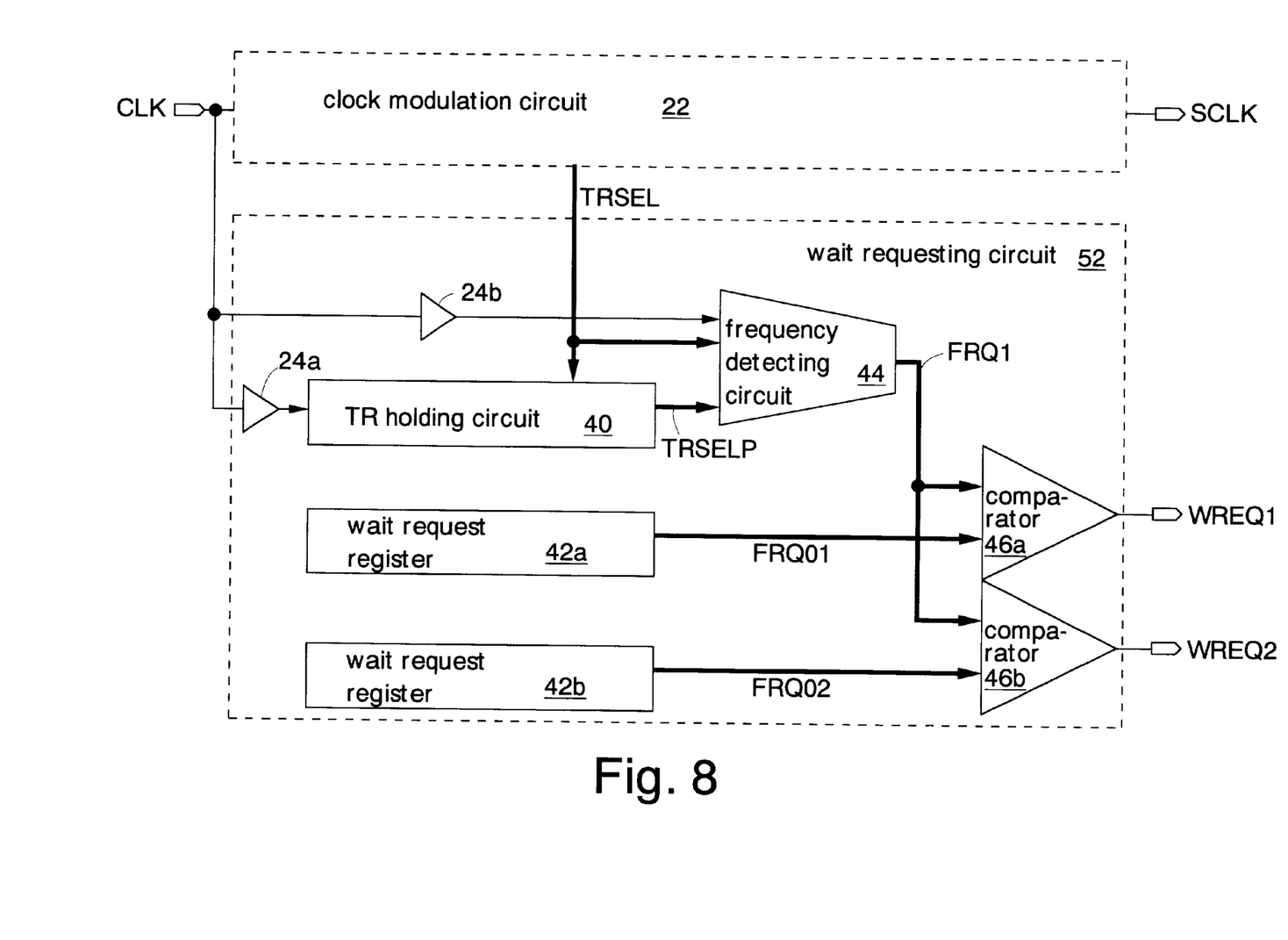
FIG. 8 is a block diagram showing in detail a wait requesting circuit of FIG. 7.

FIG. 8 shows the wait requesting circuit 52 in detail. The wait requesting circuit 52 includes a wait request register 42a and a comparator 46a for outputting the wait requesting signal WREQ1, and a wait request register 42b and a comparator 46b for outputting the wait requesting signal WREQ2. The rest of the structure is almost identical to the wait requesting circuit 24 in the first embodiment. The wait request registers 42a and 42b are the circuits identical to the wait request register 42 in FIG. 2. Namely, the wait request registers 42a and 42b can be set from the exterior of the MCU 50, and each hold frequency information (reference frequency) indicating the frequency of the system clock signal SCLK which needs the wait request, respectively. The comparators 46a, 46b are the circuits identical to the comparator 46 in FIG. 2.

Supposing that, for example, the frequency information indicating the frequencies of 25 MHz and 30 MHz are respectively held in the wait request register 42a and 42b. In this case, when the frequency of the system clock signal SCLK is equal to or lower than 25 MHz, both of the wait requesting signals WREQ1 and WREQ2 are inactivated (one wait is inserted). When the frequency of the system clock signal SCLK is higher than 25 MHz and is equal to or lower than 30 MHz, only the wait requesting signal WREQ1 is activated (two waits are inserted). When the frequency of the system clock signal SCLK is higher than 30 MHz, both of the wait requesting signals WREQ1 and WREQ2 are activated (three waits are inserted).

The same effects as those of the above-described first embodiment can be obtained in this embodiment as well. Moreover, in this embodiment, the two wait request registers 42a and 42b and the two comparators 46a and 46b are formed to generate the two types of wait requesting signals WREQ1 and WREQ2, and therefore, the predetermined wait cycle(s) can be correspondingly inserted to the three frequency ranges of the system clock signal SCLK. Since the number of the wait cycle(s) to be inserted can be controlled more strictly as compared with the first embodiment, the performance of the system can be improved further.

Incidentally, in the above-described embodiments, the example of detecting the frequency of the system clock signal SCLK by using the edge electing signal TRSEL corresponding to the rising edge of the clock signal CLK is explained. The present invention is not limited to the above embodiments. For example, it is suitable to detect the frequency of the system clock signal SCLK by using the edge selecting signal TFSEL. It is also suitable to detect the frequency of the system clock signal SCLK by using both of the edge selecting signals TRSEL and TFSEL. It is preferable to decide which edge selecting signal to use by considering to which edge of the system clock signal SCLK the peripheral circuits 14, 16, and 18 synchronize to operate.

In the above-described embodiments, the example of generating the selecting signals TRSEL and TFSEL for each cycle of the clock signal CLK is explained. The present invention is not limited to the above embodiments. For example, the selecting signals TRSEL and TFSEL may be generated every two cycles or every three cycles, in accordance with the operation cycles of the peripheral circuits 14, 16, and 18.

In the above-described first embodiment, the example of structuring the system by mounting the oscillator 10, the MCU 12 and the peripheral circuits 14, 16, and 18 on the printed-wiring board is explained. The present invention is not limited to the above embodiment. For example, the oscillator 10, the MCU 12 and the peripheral circuits 14, 16, and 18 may be layered three-dimensionally and molded in one package, thereby structuring the system.

The invention is not limited to the above embodiments and various modifications may be made without departing from the spirit and scope of the invention. Any improvement may be made in part or all of the components.

What is claimed is:

1. A semiconductor integrated circuit, comprising:
    a clock modulation circuit to modulate a frequency of a clock signal to generate a modulated clock signal; and
    a wait requesting circuit to receive frequency information indicating the frequency of said modulated clock signal and, when the frequency information indicates a frequency higher than a reference frequency, generates a wait requesting signal to an external bus interface.

2. The semiconductor integrated circuit according to claim 1, wherein
    said wait requesting circuit includes a frequency detecting circuit
        to successively receive timing information as said frequency information, the timing information indicating timing of edges of said modulated clock signal, and
        to detect the frequency of said modulated clock signal from a difference between said two timing information.

3. The semiconductor integrated circuit according to claim 2 wherein:
    said wait requesting circuit includes a holding circuit to latch said timing information; and
    said frequency detecting circuit determines the frequency of said modulated clock signal from a difference between a current timing information and a timing information already held in said holding circuit.

4. The semiconductor integrated circuit according to claim 1, wherein
    said wait requesting circuit includes a register which can set said reference frequency from the exterior.

5. The semiconductor integrated circuit according to claim 1, wherein
    said wait requesting circuit includes a plurality of registers, respectively holding a plurality of said reference frequencies, and generates a plurality of said wait requesting signals according to said reference frequencies, respectively, when said frequency information indicates a frequency higher than said reference frequencies.

6. A semiconductor integrated circuit, comprising:
    a clock modulation circuit to modulate a frequency of a clock signal to generate a modulated clock signal; and
    a wait requesting circuit to receive frequency information indicating the frequency of said modulated clock signal and, in accordance with a change in the frequency of the modulated clock signal, generates a wait requesting signal to an external bus interface.

* * * * *